(12) United States Patent
Shinoda et al.

(10) Patent No.: US 8,774,571 B2
(45) Date of Patent: Jul. 8, 2014

(54) OPTICAL DEVICE, OPTICAL MODULE, AND METHOD FOR MANUFACTURING OPTICAL DEVICE

(75) Inventors: Kazunori Shinoda, Musashino (JP); Shigeki Makino, Tokyo (JP); Hideo Arimoto, Kodaira (JP)

(73) Assignee: Oclaro Japan, Inc., Kanagawa (JP)

( * ) Notice: Subject to any disclaimer, the term of this patent is extended or adjusted under 35 U.S.C. 154(b) by 71 days.

(21) Appl. No.: 13/590,718

(22) Filed: Aug. 21, 2012

(65) Prior Publication Data

US 2013/0051725 A1    Feb. 28, 2013

(30) Foreign Application Priority Data

Aug. 23, 2011  (JP) ................................. 2011-181886
Jun. 28, 2012  (JP) ................................. 2012-146126

(51) Int. Cl.
  *G02B 6/12*    (2006.01)
(52) U.S. Cl.
  USPC ................ 385/14; 216/24; 385/131; 257/17; 438/39
(58) Field of Classification Search
  CPC ............ G02B 6/43; G02B 6/136; G02B 6/24
  USPC .................... 385/14, 29, 131; 372/44, 50, 26; 257/17, 21; 216/24
  See application file for complete search history.

(56) References Cited

U.S. PATENT DOCUMENTS

| | | | |
|---|---|---|---|
| 5,852,304 A * | 12/1998 | Suzuki et al. .................... 257/17 |
| 7,072,557 B2 * | 7/2006 | Nagarajan et al. ............ 385/131 |
| 7,593,445 B2 * | 9/2009 | Sasada et al. .............. 372/50.11 |
| 7,773,840 B2 * | 8/2010 | Kwakernaak et al. .......... 385/29 |
| 2007/0297475 A1 * | 12/2007 | Sasada et al. .............. 372/44.01 |
| 2008/0037605 A1 | 2/2008 | Yamatoya et al. |

FOREIGN PATENT DOCUMENTS

JP    2008-066703 A    3/2008

OTHER PUBLICATIONS

Nicholes et al., "Integration Technologies for an 8x8 InP-Based Monolithic Tunable Optical Router with 40 Gb/s Line Rate Per Port"; Conference Proceedings of 22th International Conference on Indium Phosphide and Related Materials, May 31-Jun. 4, 2010; WeA3-1, pp. 160-163.

* cited by examiner

*Primary Examiner* — Ellen Kim
(74) *Attorney, Agent, or Firm* — Mattingly & Malur, PC

(57) ABSTRACT

An optical device includes a substrate and a first optical waveguide including a mesa. The mesa includes a first lower clad layer portion, a first core layer portion, and a first upper clad layer portion. The first lower clad layer portion, the first core layer portion, and the first upper clad layer portion are disposed in this order from the substrate side. The optical device also includes a first etch stop layer configured to stop etching when the first optical waveguide is formed. The first etch stop layer being laminated over the substrate. The first optical waveguide is laminated on the first etch stop layer.

17 Claims, 10 Drawing Sheets

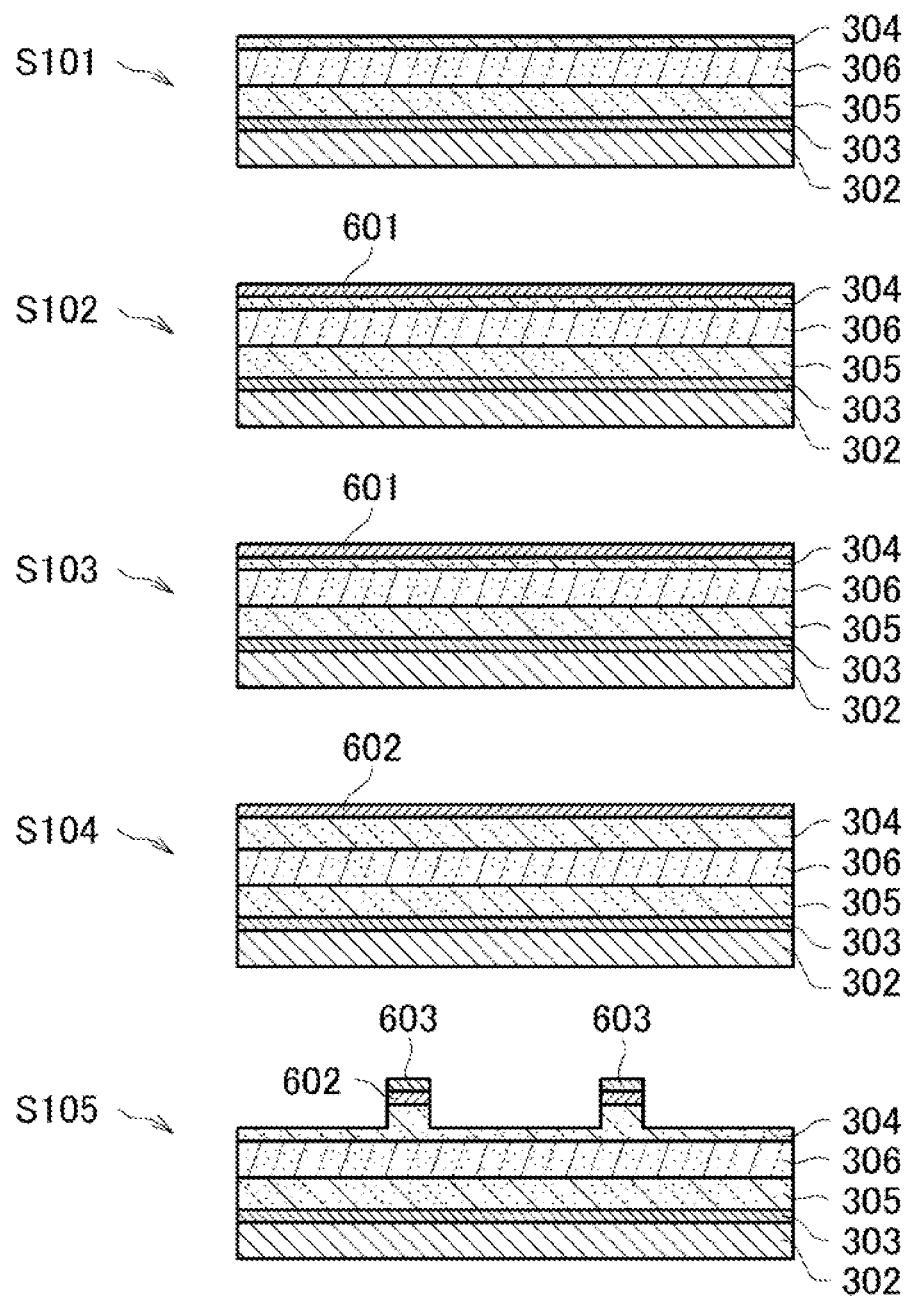

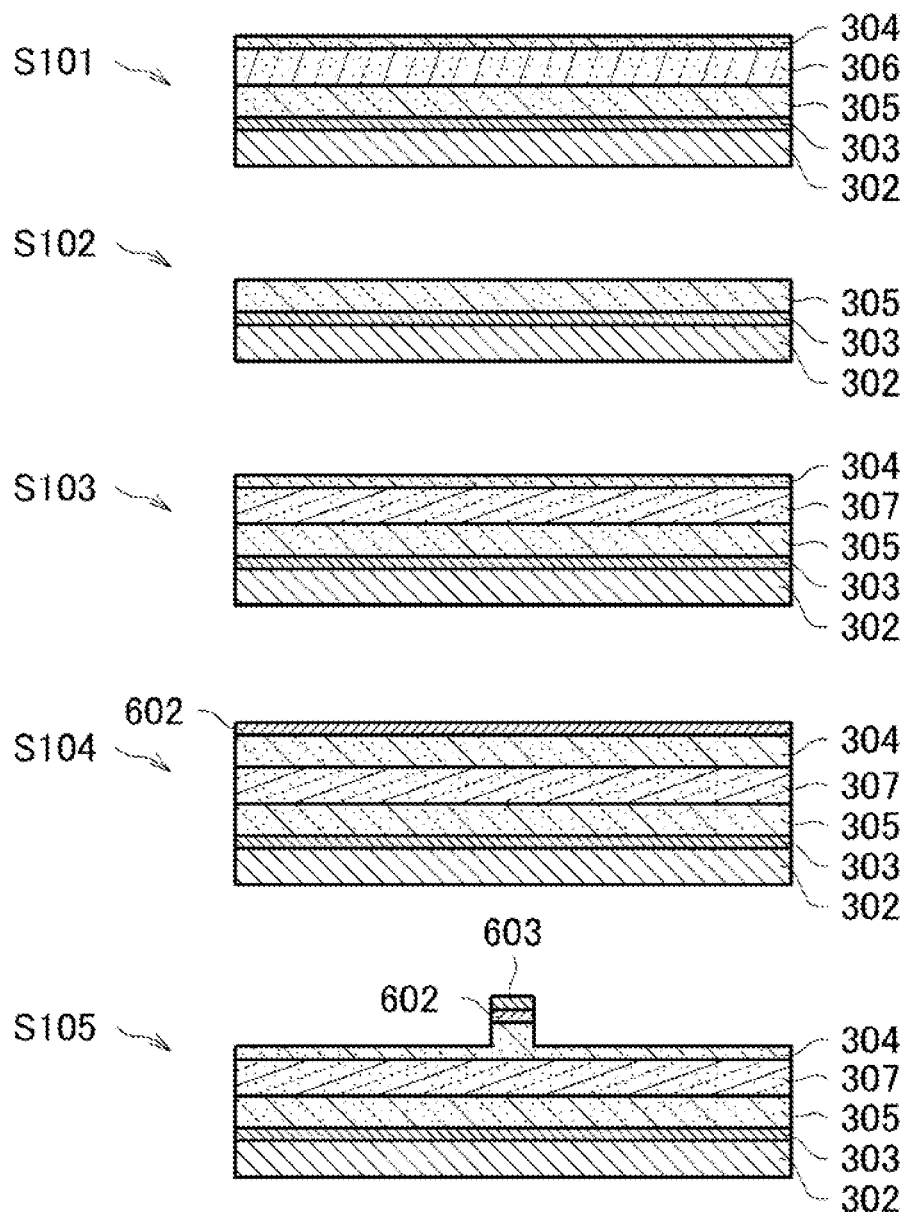

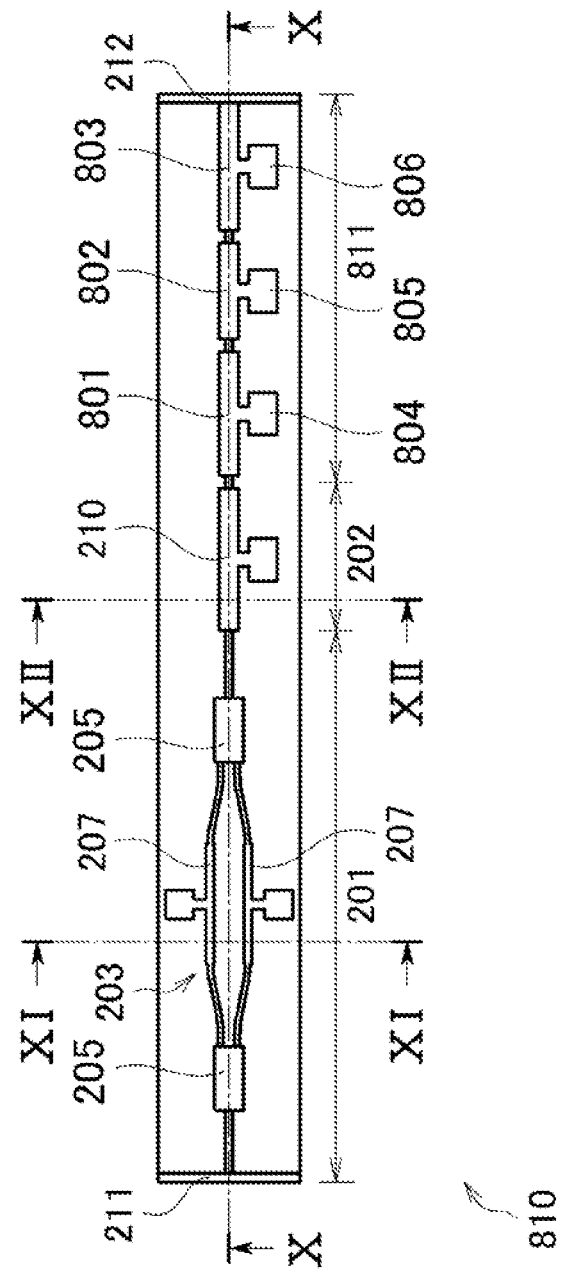

OPTICAL DEVICE, OPTICAL MODULE, AND METHOD FOR MANUFACTURING OPTICAL DEVICE

CROSS-REFERENCE TO RELATED APPLICATION

The present application claims priority from Japanese Applications JP 2011-181886 filed on Aug. 23, 2011 and JP 2012-146126 filed on Jun. 28, 2012, the content of which is hereby incorporated by reference into this application.

BACKGROUND OF THE INVENTION

1. Field of the Invention

The present invention relates to an optical device, an optical module, and a method for manufacturing an optical device.

2. Description of the Related Art

The widespread use of broadband services via the Internet leads to a rapid increase in communication traffic flowing on the network. The capacities of a trunk network between large cities or continents and a metropolitan network connecting adjacent cities are actively increased. Also in a datacom such as a storage network or Ethernet (trademark) as well as a conventional telecom network, the technology for increasing the capacity of a system has become more and more important. The throughput of a high-speed interface device for such network is limited by a speed per channel and also the package density determined by the module size and power consumption. Therefore, the downsizing of a module is an important issue.

For example, in a 10 Gbps optical transceiver module, a more compact module such as a 10-Gigabit small form-factor pluggable (XFP) module or a small form-factor pluggable plus (SFP+) module has become widespread in place of a conventional relatively large 300-pin module. In a tunable transceiver module that operates in the entire C-band region of wavebands from 1,530 nm to 1,570 nm, in place of a 300-pin large-form factor (LFF) module and a 300-pin small-form factor (SFF) module which are now prevailing, the downsizing to a compact XFP module whose volume is about 1/15 is being strongly demanded.

The key technology for downsizing an optical module is an integration technology for optical devices. For example, in a middle and long distance transceiver module for a metropolitan network, a distributed feedback (DFB) laser source in which semiconductor electro-absorption modulators are monolithically-integrated is used on the transmission side, thereby realizing a compact optical transceiver module. This method has already been put into practical use.

The integration technology for optical devices is roughly divided into two types. One is an integration technology from the viewpoint of how to connect core layers of waveguide optical devices together. The other is an integration technology from the viewpoint of how to connect mesa structures of waveguide optical devices together.

Specifically, examples of the integration technology from the viewpoint of how to connect the core layers of the waveguide optical devices together include a butt joint method and a region selective growth method. The butt joint method is a technology for integration by joining a plurality of optical waveguides on the same substrate by butting the optical waveguides. In the process, first, crystals of a core layer of a first waveguide optical device are grown on a semiconductor substrate, and then, a part of the core layer is covered by a mask pattern and the remaining part not covered by the mask pattern is removed with the use of an etching technology. Subsequently, with the use of metal organic chemical vapor deposition, crystals of a core layer of a second waveguide optical device are grown in a region of the core layer of the first waveguide optical device which has been removed by etching, to thereby connect the core layer of the first waveguide optical device and the core layer of the second waveguide optical device to each other. This process is repeated the required number of times. According to this technology, the material compositions, the multilayer structures, and the thicknesses of the respective core layers of the waveguide optical devices can be optimized independently. The butt joint method is therefore widely used as a method of manufacturing a high-performance integrated optical device, as compared to the region selective growth method to be described below, which forms core layers of a plurality of waveguide optical devices at once by single selective growth.

On the other hand, the region selective growth method is a technology of utilizing a region selective growth effect in metal organic chemical vapor deposition using an insulator mask, to thereby positionally control the bandgap energy and the thickness of a crystal layer in the substrate plane. According to this technology, core layers of a plurality of waveguide optical devices can be formed at once by single crystal growth. The region selective growth method is therefore widely used as a method of manufacturing a low-cost integrated optical device with a smaller number of crystal growths.

An exemplary integration technology from the viewpoint of how to connect mesa structures of waveguide optical devices together is an integration technology for a high-mesa optical waveguide and a low-mesa optical waveguide. As used herein, the high-mesa optical waveguide and the low-mesa optical waveguide are the names of a mesa optical waveguide structure grouped from the viewpoints of the mesa height and the positional relationship between the mesa and a core layer.

Specifically, the high-mesa optical waveguide is a mesa optical waveguide formed by processing a semiconductor multilayer structure including an upper clad layer, a core layer, and a lower clad layer by etching. The high-mesa optical waveguide has a feature that the core layer is positioned inside the mesa, and the mesa height is larger as compared to the low-mesa optical waveguide to be described below. Other features of the high-mesa optical waveguide include a larger light confinement effect and a small electric capacitance. The structure of the high-mesa optical waveguide is thus widely used for a Mach-Zehnder modulator and the like.

On the other hand, the low-mesa optical waveguide is a mesa optical waveguide formed by processing the upper clad layer of the semiconductor multilayer structure by etching. Unlike the high-mesa optical waveguide, the core layer is not etched in the low-mesa optical waveguide. In the low-mesa optical waveguide, the core layer is therefore positioned outside the lower side of the mesa, and the mesa height is smaller as compared to the above-mentioned high-mesa optical waveguide. The feature of the low-mesa optical waveguide is a small light confinement effect. The structure of the low-mesa optical waveguide is thus widely used for a semiconductor laser and the like.

As a known example of the conventional integration technology for the high-mesa optical waveguide and the low-mesa optical waveguide, an integrated optical device in which a semiconductor Mach-Zehnder modulator having a high-mesa optical waveguide structure and a semiconductor optical modulator having a low-mesa optical waveguide structure are monolithically-integrated in the same substrate plane is disclosed in Japanese Patent Application Laid-open No. 2008-66703. Another integrated optical device in which a wavelength converter having a low-mesa optical waveguide structure and a semiconductor Mach-Zehnder modulator having a high-mesa optical waveguide structure are monolithically-integrated is disclosed in Steven C. Nicoles, et al., "Integration Technologies for an 8×8 InP-Based Monolithic Tunable Optical Router with 40 Gb/s Line Rate Per Port", Conference Proceedings of 22th International Conference on Indium Phosphide and Related Materials, 31 May-4 June, WeA3-1, pp. 160-163, 2010.

SUMMARY OF THE INVENTION

In the high-mesa optical waveguide structure as described above, the shape of the high-mesa optical waveguide (high mesa) has a small width and a large height and is elongated. Specifically, for example, the width of the high mesa is about 1 to 2 μm, the height of the high mesa is about 4 to 5 μm, and the length of the high mesa is about 1,000 to 2,000 μm. Therefore, the high mesa may become higher than a design value because of, for example, a non-uniform in-plane distribution of the etching depth in the etching process. In this case, the mechanical strength of the high mesa is lowered, and the mesa is easily broken in the process, resulting in a problem of low yields.

Further, in a structure in which the optical waveguide having a high-mesa structure and the optical waveguide having a low-mesa structure are formed in a single device, the height of the high-mesa structure is about 4 to 5 μm while the height of the low-mesa structure is about 2 to 2.5 μm, and hence the etching depth of semiconductors is different in the manufacturing. As a manufacturing method, dry etching adjusted for the height of a low-mesa portion is first performed, and additional dry etching is performed for a high-mesa portion. An additional etching amount for the high-mesa portion is about 2 to 2.5 μm, which is substantially the same as an etching amount for the low-mesa portion. In this case, dry etching is once performed for forming the low mesa, and hence dry etching for forming the high mesa is performed in the state in which the in-plane distribution of etching is already non-uniform. Therefore, the height of the high mesa may become higher than a design value because the in-plane distribution of the etching depth in the dry etching process is emphasized so that the height becomes more non-uniform. In this case, the mechanical strength of the high mesa is lowered, and the mesa is easily broken in the process, resulting in a problem of low yields.

In view of the above-mentioned problems, it is an object of one or more embodiments of the present invention to provide an optical device, an optical module including an optical device, a method of manufacturing an optical device, and a method of manufacturing an optical module including an optical device, which improve yields in a step of manufacturing a high-mesa optical waveguide.

It is another object of one or more embodiments of the present invention to provide an optical device, an optical module including an optical device, a method of manufacturing an optical device, and a method of manufacturing an optical module including an optical device, which improve yields in a step of manufacturing a high-mesa optical waveguide portion in a structure in which an optical waveguide having a high-mesa structure and an optical waveguide having a low-mesa structure are formed in a single device.

(1) In one or more embodiments of the present invention, an optical device includes a substrate and a first optical waveguide including a mesa. The mesa includes a first lower clad layer portion, a first core layer portion, and a first upper clad layer portion. The first lower clad layer portion, the first core layer portion, and the first upper clad layer portion are disposed in this order from the substrate side. The optical device also includes a first etch stop layer configured to stop etching when the first optical waveguide is formed. The first etch stop layer being laminated over the substrate. The first optical waveguide is laminated on the first etch stop layer.

(2) In the optical device according to (1), the first optical waveguide includes a tapered portion in a region that is brought into contact with the first etch stop layer. The tapered portion has a width increasing toward the substrate side.

(3) In the optical device according to (1) or (2), the optical device further includes a second optical waveguide which includes a second lower clad layer portion, a second core layer portion, and a mesa-shaped second upper clad layer portion in this order from the substrate side. The second optical waveguide is laminated on the first etch stop layer. The first core layer portion and the second core layer portion are optically connected to each other.

(4) In the optical device according to (3), the second core layer portion includes a second core layer configured to stop etching when the second optical waveguide is formed.

(5) In the optical device according to (3), the first optical waveguide has a high-mesa structure in which the first lower clad layer portion, the first core layer portion, and the first upper clad layer portion are processed by etching. The second optical waveguide has a low-mesa structure in which the mesa-shaped second upper clad layer portion is processed by etching.

(6) In the optical device according to (3), the second optical waveguide further includes a second etch stop layer configured to stop etching when the second optical waveguide is formed into a low-mesa structure. The second etch stop layer is provided between the second core layer portion and the mesa-shaped second upper clad layer portion.

(7) In the optical device according to one of (1) to (6), the first etch stop layer is formed of one of InGaAsP and InGaAlAs, and the substrate is InP.

(8) In the optical device according to (7), the one of InGaAsP and InGaAlAs, which forms the first etch stop layer, is lattice-matched with InP, which forms the substrate.

(9) In the optical device according to one of (1) to (8), the first etch stop layer covers an entire surface of the substrate.

(10) In the optical device according to one of (3) to (9), the optical device comprises an integrated optical device in which a semiconductor Mach-Zehnder optical modulator including the first optical waveguide and a semiconductor optical modulator including the second optical waveguide are integrated.

(11) In the optical device according to one of (3) to (10), the first lower clad layer portion and the second lower clad layer portion are formed by the same clad layer.

(12) In one or more embodiments of the present invention, an optical module includes the optical device according to one of (1) to (11).

(13) In one or more embodiments of the present invention, a method for manufacturing an optical device includes forming a first etch stop layer over a substrate, forming a laminate structure on the first etch stop layer. The laminate structure includes a first lower clad layer, a first core layer, and a first upper clad layer in this order. The method further includes etching the laminate structure up to the first etch stop layer so as to form a first optical waveguide including a mesa. The mesa includes a first lower clad layer portion, a core layer portion, and a first upper clad layer portion.

(14) In the method according to (13), the method further includes forming a laminate structure above the first etch stop layer. The laminate structure includes a second core layer, a second etch stop layer, and a second clad layer for forming a second optical waveguide. The method further includes etching the laminate structure up to the second etch stop layer, to form the second optical waveguide.

(15) In one or more embodiments of the present invention, a method for manufacturing an optical device includes forming a first etch stop layer over a substrate and forming a first laminate structure on the first etch stop layer. The first laminate structure includes a first lower clad layer, a first core layer, and a first upper clad layer in this order. The method also includes forming a second laminate structure above the first etch stop layer. The second laminate structure includes a second core layer, a second etch stop layer, and a second clad layer configured to form a second optical waveguide. The method further includes a first etching step of etching the first laminate structure and the second laminate structure up to a part of the second clad layer, a second etching step of etching the first laminate structure up to a part of the first lower clad layer, while masking the second laminate structure, and a third etching step of etching the first laminate structure and the second laminate structure up to the first etch stop layer and the second etch stop layer after a mask is removed. A first optical waveguide and a second optical waveguide are formed simultaneously. The first optical waveguide has a high-mesa structure, which includes a mesa including the first lower clad layer, the first core layer, and the first upper clad layer. The second optical waveguide has a low-mesa structure, which includes a mesa including the second clad layer.

BRIEF DESCRIPTION OF THE DRAWINGS

In the accompanying drawings:

FIG. 7A is a diagram illustrating the steps of the manufacturing method according to the first embodiment;

FIG. 8A is a diagram illustrating the steps of the manufacturing method according to the first embodiment;

FIG. 9 schematically illustrates a top surface of an optical device according to a second embodiment of the present invention;

DETAILED DESCRIPTION OF THE INVENTION

Figure 1:
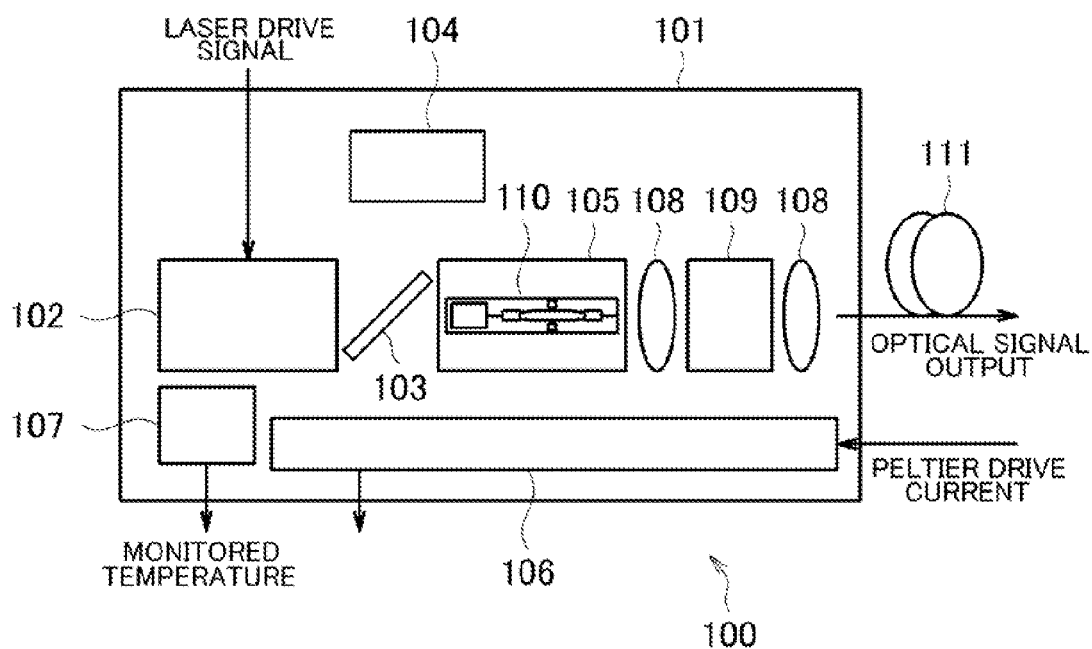
FIG. 1 is a diagram illustrating an overall configuration of an optical module according to a first embodiment of the present invention.

Referring to the accompanying drawings, embodiments of the present invention are described below. In the drawings, the same or similar components are denoted by the same reference symbols, and repetitive description thereof is omitted.

[First Embodiment]

FIG. 1 is a diagram illustrating an overall configuration of an optical module according to a first embodiment of the present invention. As illustrated in FIG. 1, an optical module 100 includes, in a package 101, a tunable laser 102, a half mirror 103, a wavelength locker 104, a carrier 105, a Peltier 106, a thermistor 107, a plurality of condenser lenses 108, and an optical isolator 109.

The carrier 105 is provided with a terminator (not shown), and incorporates an optical device 110 including a semiconductor Mach-Zehnder modulator. The package 101 is formed by processing a metal material into a box shape. For example, the package 101 includes a baseplate made of a CuW alloy having high thermal conductivity, a frame made of a FeNi alloy, a ceramic feedthrough on which a wiring pattern for transmitting an electrical signal to the inside of the package 101 is formed, a lead terminal, a seam ring for seam-welding a cap, sapphire glass for hermetically sealing a window through which light is extracted, and a pipe member for fixing a lens holder and an optical fiber by welding.

The tunable laser 102 emits light having a wavelength corresponding to a laser drive signal input from a control portion (not shown). The emitted light enters the wavelength locker 104 and the optical device 110 via the half mirror 103.

The wavelength locker 104 measures the light output from the tunable laser 102, and adjusts the wavelength of the tunable laser 102 in accordance with the wavelength of the measured light. For example, in the case where a semiconductor Mach-Zehnder modulator having small wavelength dependence is used as the optical device 110, high-speed operation at 10 Gbit/s can be performed in the C-band wavelength region from 1,528 nm to 1,568 nm.

The thermistor 107 detects temperature of the optical device 110, and outputs the detected temperature to the control portion as a monitored temperature signal. In response to the monitored temperature signal, the control portion outputs a Peltier drive current signal to the Peltier 106. In this manner, the temperature of the optical device 110 is maintained constant.

To the optical device 110, an optical signal is input from the tunable laser 102 via the half mirror 103. For example, the optical device 110 modulates the optical signal in accordance with a modulation drive signal input from the control portion. The modulated optical signal is output to an optical fiber 111 on the output side via the condenser lens 108, the optical isolator 109, and the condenser lens 108 in this order.

The configuration of the optical module 100 illustrated in FIG. 1 is merely an example, and the optical module according to this embodiment is not limited thereto. For example, the tunable laser 102 and other components may be provided outside the package 101 so that light from the tunable laser 102 may be input to the optical device 110 via an optical fiber on the input side. Alternatively, the tunable laser 102 may be integrated in the optical device 110.

Figure 2:
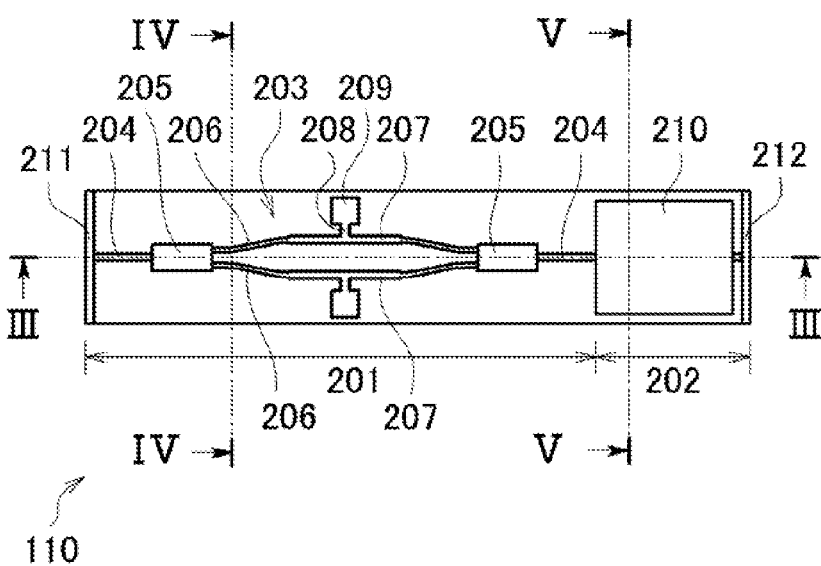
FIG. 2 schematically illustrates a top surface of an optical device illustrated in FIG. 1.

FIG. 2 schematically illustrates a top surface of the optical device according to this embodiment. As illustrated in FIG. 2, the optical device 110 includes a semiconductor Mach-Zehnder modulator 201 and a semiconductor optical modulator 202. In other words, the optical device 110 corresponds to a device in which the semiconductor Mach-Zehnder modulator 201 and the semiconductor optical modulator 202 are monolithically-integrated.

As used herein, the semiconductor Mach-Zehnder modulator 201 has a high-mesa structure while the semiconductor optical modulator 202 has a low-mesa structure.

As illustrated in FIG. 2, the semiconductor Mach-Zehnder modulator 201 includes an optical waveguide portion 203 provided so as to cross substantially the center thereof. The optical waveguide portion 203 includes an optical waveguide 204, a coupler 205, two modulated waveguides 206, a coupler 205, and an optical waveguide 204 in the incident direction of light. As the coupler 205, for example, a multimode interferometer (MMI) coupler is used.

The semiconductor Mach-Zehnder modulator 201 further includes a pair of semiconductor Mach-Zehnder modulator p-electrodes 207 at the top of part of the two modulated waveguides 206, respectively. The semiconductor Mach-Zehnder modulator p-electrodes 207 are connected to electrode pads 209 via lead wires 208. A voltage is applied to each modulated waveguide 206 via the electrode pad 209. FIG. 2 illustrates the configuration in which two electrode pads 209 are disposed, but this embodiment is not limited thereto, and a different number of electrode pads 209 may be disposed. Further, the shape of the electrode pad 209 may be different from that illustrated in FIG. 2.

The semiconductor optical modulator 202 includes a semiconductor optical modulator p-electrode 210 at the top thereof. The semiconductor optical modulator 202 is optically connected to the semiconductor Mach-Zehnder modulator 201 via the optical waveguide 204. The details thereof are described later. The optical device 110 further includes reflection-free coating films 211 and 212 at both ends thereof.

Figure 3:
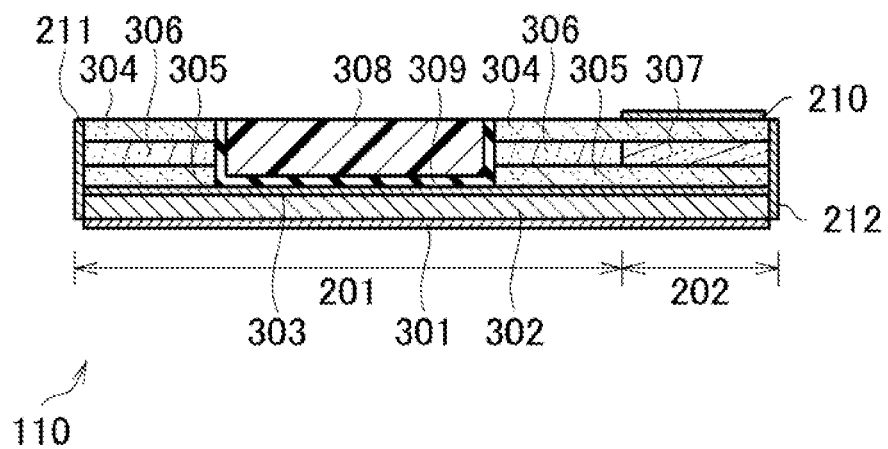
FIG. 3 schematically illustrates a cross-section taken along the line III-III of FIG. 2.

FIG. 3 schematically illustrates a cross-section taken along the line III-III of FIG. 2. As illustrated in FIG. 3, the optical device 110 includes an n-electrode 301, an n-type InP substrate 302 (substrate), and a high-mesa etch stop layer 303 in this order from the bottom of FIG. 3. Specifically, a high-mesa etch stop layer 303 made of InGaAsP having a thickness of, for example, about 5 nm is formed on the entire surface of the n-type InP substrate 302. In this case, the high-mesa etch stop layer 303 made of InGaAsP is lattice-matched with InP of the n-type InP substrate 302. The lattice matching as used herein refers to the state in which a lattice constant difference between target crystal layers is within the range of about ±0.3% so that the lattices are matched to such an extent that no cross-hatch is observed during crystal growth.

The semiconductor Mach-Zehnder modulator 201 includes a semiconductor Mach-Zehnder modulator core layer 306, which is provided above the high-mesa etch stop layer 303 and sandwiched between a p-type InP clad layer 304 and an n-type InP clad layer 305. As illustrated in FIG. 3, a resin 308, a passivation film 309, and the like are disposed in a region between the modulated waveguides 206. The details thereof are described later. The semiconductor optical modulator 202 includes a semiconductor optical modulator core layer 307 sandwiched between the p-type InP clad layer 304 and the n-type InP clad layer 305. The semiconductor Mach-Zehnder modulator core layer 306 and the semiconductor optical modulator core layer 307 are connected to each other by the above-mentioned butt joint.

The semiconductor Mach-Zehnder modulator core layer 306 is, for example, a 20-period InGaAsP unstrained multi-quantum well layer which is sandwiched by a pair of InGaAsP light confinement layers from above and below. For example, the thickness of a quantum well layer is about 6 nm and the thickness of a barrier layer is about 7 nm. The semiconductor optical modulator core layer 307 has, for example, a 10-period InGaAsP strained multi-quantum well structure which is sandwiched by a pair of InGaAsP light confinement layers from above and below. For example, the thickness of a quantum well layer is about 8 nm and the thickness of a barrier layer is about 5 nm.

In this embodiment, a low-mesa etch stop layer, which is described later, is not separately provided at the top of the semiconductor optical modulator core layer 307. However, the InGaAsP light confinement layer (not shown) formed at the uppermost part of the semiconductor optical modulator core layer 307 has the function as a low-mesa etch stop layer, that is, the function of stopping etching to be described later.

Figure 4:
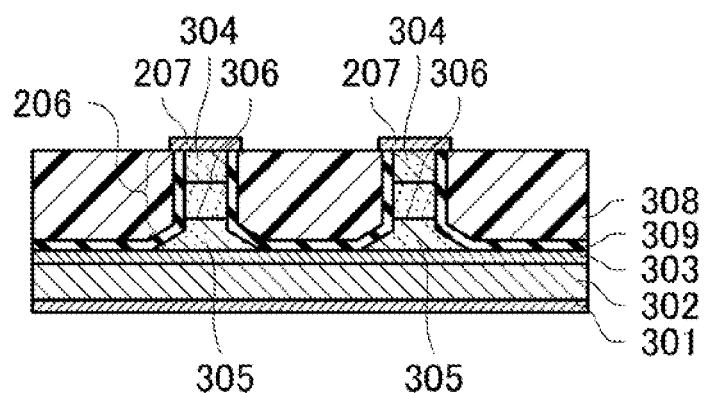
FIG. 4 schematically illustrates a cross-section taken along the line IV-IV of FIG. 2.

FIG. 4 schematically illustrates a cross-section taken along the line IV-IV of FIG. 2. As illustrated in FIG. 4, the optical waveguide portion 203 of the semiconductor Mach-Zehnder modulator 201 has a high-mesa optical waveguide structure.

Specifically, as illustrated in FIG. 4, the optical waveguide portion 203 of the semiconductor Mach-Zehnder modulator 201 includes the n-type InP clad layer 305, the semiconductor Mach-Zehnder modulator core layer 306, and the p-type InP clad layer 304 in this order from the substrate 302 side. In regions in which the modulated waveguides 206 are not formed (regions on both sides of the modulated waveguides 206), the resin 308 is laminated on the high-mesa etch stop layer 303 through the intermediation of the passivation film 309. The passivation film 309 is formed on the side surfaces of the modulated waveguides 206 and on the high-mesa etch stop layer 303. The semiconductor Mach-Zehnder modulator p-electrode 207 is further laminated at the top of each modulated waveguide 206.

In this case, the optical waveguide portion 203 formed by the n-type InP clad layer 305, the semiconductor Mach-Zehnder modulator core layer 306, and the p-type InP clad layer 304 corresponds to a high mesa. For example, the high mesa has a width of about 1.4 μm and a height of about 4 μm.

As described later, the high mesa is formed by processing the p-type InP clad layer 304, the semiconductor Mach-Zehnder modulator core layer 306, and the n-type InP clad layer 305 by etching, for example, a combination of dry etching and wet etching. Thus, the mesa height (height from the top surface of the high-mesa etch stop layer 303 to the top of the high mesa) is defined by the position of the high-mesa etch stop layer 303 made of InGaAsP. In this way, the height of the high-mesa structure of the optical device 110 is defined by the high-mesa etch stop layer 303, and hence the mesa height of the high mesa is prevented from being unnecessarily increased by an in-plane distribution of the etching depth or the like. Therefore, the mechanical strength of the high mesa is enhanced.

As illustrated in FIG. 4, the high mesa includes a tapered portion having a skirt shape at the bottom thereof, in which the width increases toward the substrate 302 side. For example, the tapered portion is formed by etching a forward-mesa-striped InP clad layer 305 by a hydrochloric acid-based wet etchant. The principal surface of the tapered portion is a (211) crystal surface.

Figure 5:
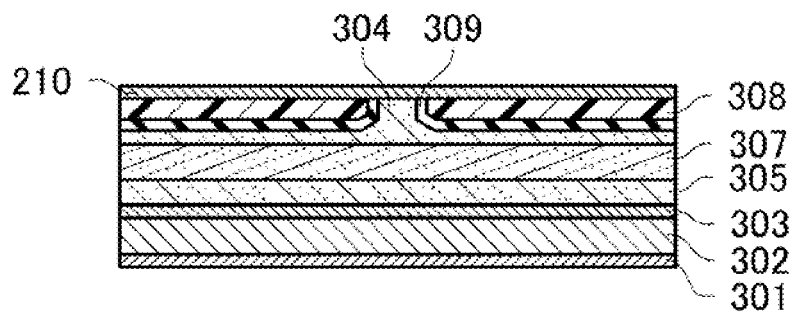
FIG. 5 schematically illustrates a cross-section taken along the line V-V of FIG. 2.

FIG. 5 schematically illustrates a cross-section taken along the line V-V of FIG. 2. In other words, FIG. 5 illustrates a cross-section of the semiconductor optical modulator 202 taken along the line V-V. As illustrated in FIG. 5, the semiconductor optical modulator 202 has a low-mesa structure, in which a low mesa is formed at substantially the center thereof.

Specifically, the semiconductor optical modulator 202 includes the n-type InP clad layer 305, the semiconductor optical modulator core layer 307, the p-type InP clad layer 304, and the semiconductor optical modulator p-electrode 210 in this order on the high-mesa etch stop layer 303. In a region in which the low mesa is not formed, the resin 308 is laminated on the p-type InP clad layer 304 through the intermediation of the passivation film 309, and the semiconductor optical modulator p-electrode 210 is laminated at the top of the resin 308. In this case, the low mesa corresponds to a portion which is formed by the mesa-shaped p-type InP clad layer 304 positioned at the center of FIG. 5 and which is positioned from the top surface of the semiconductor optical modulator core layer 307 to the bottom surface of the semiconductor optical modulator p-electrode 210. For example, the low mesa has a width of about 1.7 μm and a height of about 2.5 μm.

The low mesa is formed by processing the p-type InP clad layer 304 by etching, for example, a combination of dry etching and wet etching as described later. Specifically, the low mesa is formed by stopping etching at the top of the InGaAsP light confinement layer (not shown) formed at the uppermost part of the semiconductor optical modulator core layer 307. The low mesa includes a tapered portion having a skirt shape at the bottom thereof, which is formed by, for example, wet-etching the forward-mesa-striped p-type InP clad layer 304 by a hydrochloric acid-based wet etchant. The principal surface of the tapered portion is a (211) crystal surface. In the above description, the InGaAsP light confinement layer formed at the uppermost part of the semiconductor optical modulator core layer 307 is used as a low-mesa etch stop layer, but a separate layer may be provided as the low-mesa etch stop layer.

Next, the outline of the operation of the optical device is described. Light that has entered the optical device 110 is amplified by injection of a current between the semiconductor optical modulator p-electrode 210 formed at the top of the semiconductor optical modulator 202 and the n-electrode 301 formed on the n-type InP substrate 302 side. The amplified light is split by the coupler 205 at a proportion of about 1:1, and is guided to the two modulated waveguides 206. In this case, when a voltage is applied to the pair of semiconductor Mach-Zehnder modulator p-electrodes 207 formed on the two modulated waveguides 206, the refractive index and the absorptance of the semiconductor Mach-Zehnder modulator core layer 306 are changed. Thus, the light combined by the coupler 205 is modulated. In this way, the optical device 110 is capable of amplifying and modulating input light.

Figure 6:
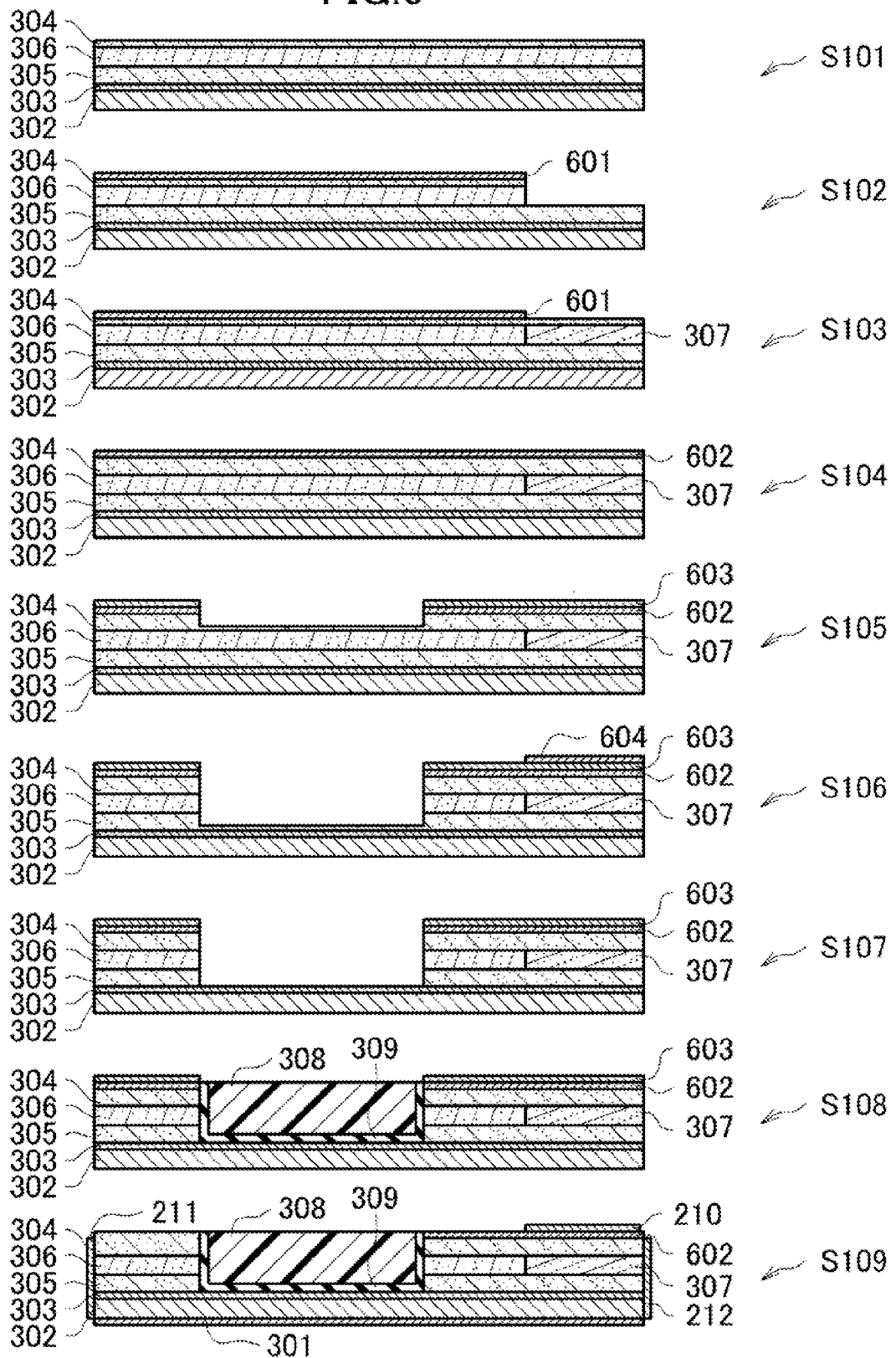
FIG. 6 is a diagram illustrating steps of a manufacturing method according to the first embodiment.
Figure 7B:
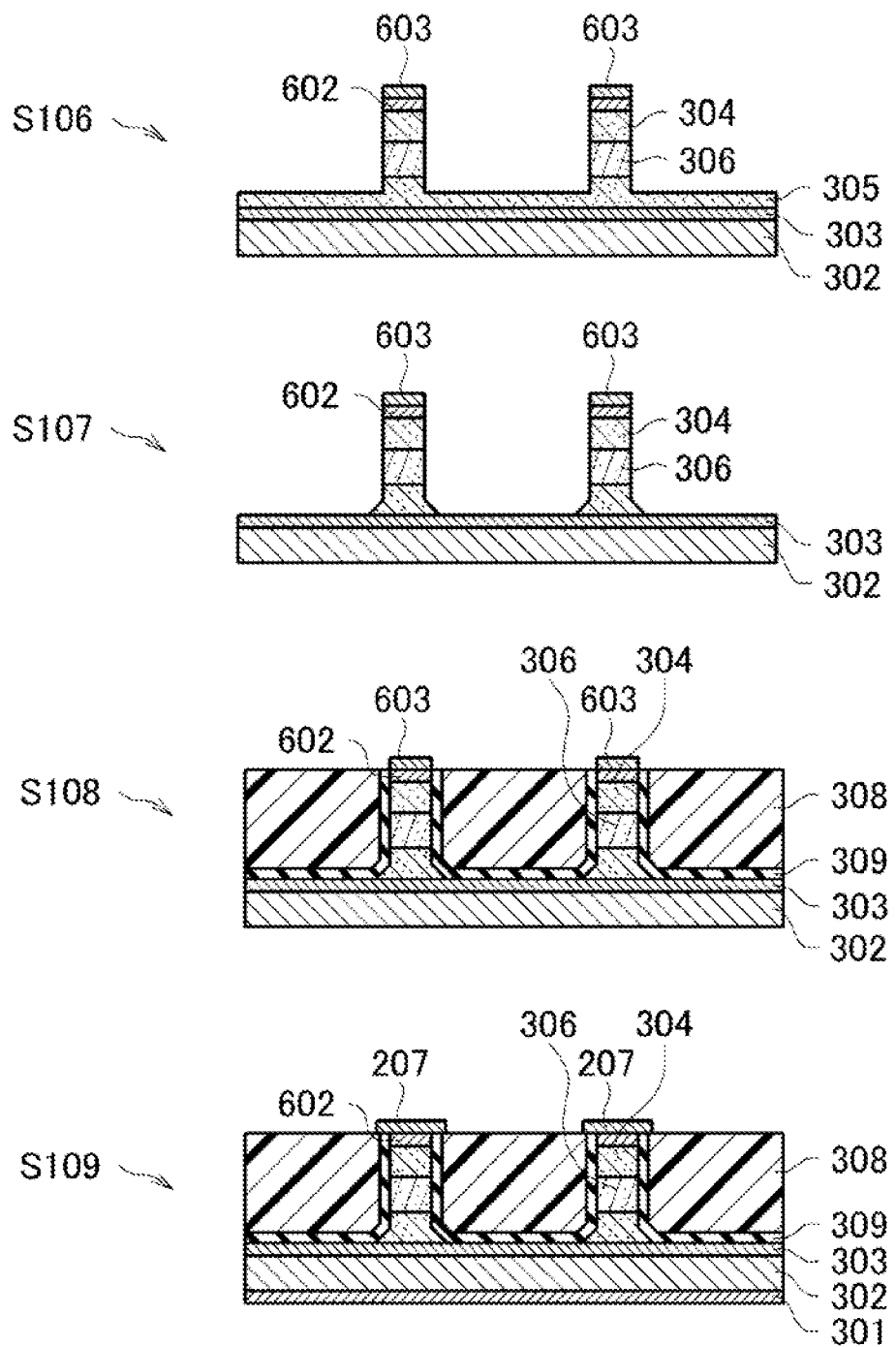
FIG. 7B is a diagram illustrating the steps of the manufacturing method according to the first embodiment.
Figure 8B:
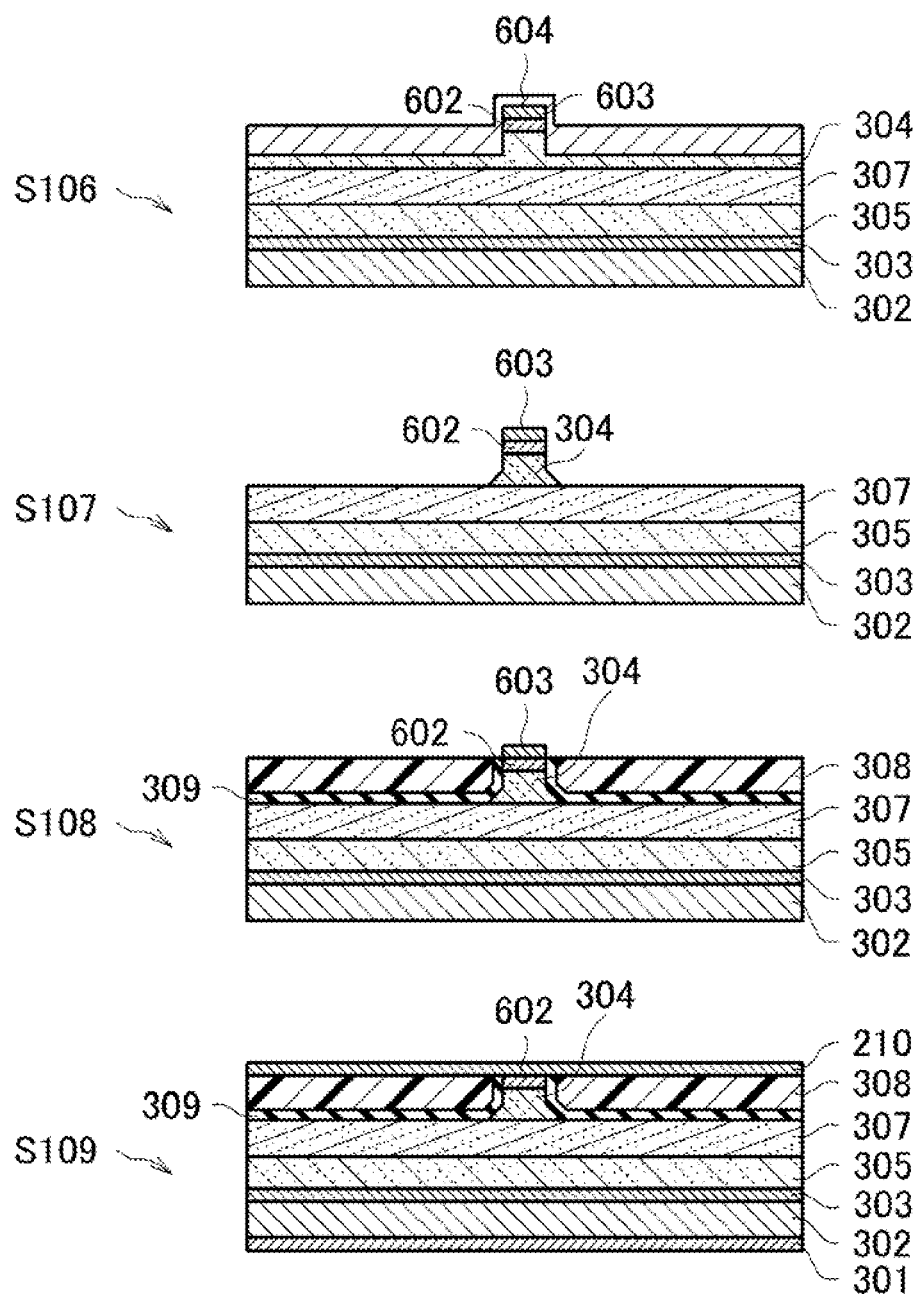
FIG. 8B is a diagram illustrating the steps of the manufacturing method according to the first embodiment.

Next, a method of manufacturing an optical device according to this embodiment is described with reference to FIGS. 6, 7A, and 7B. FIG. 6 schematically illustrates the cross-sections in the direction III-III of FIG. 2 in respective steps of the manufacturing method according to this embodiment. FIGS. 7A and 7B schematically illustrate the cross-sections in the direction IV-IV of FIG. 2 in respective steps of the manufacturing method. FIGS. 8A and 8B schematically illustrate the cross-sections in the direction V-V of FIG. 2 in respective steps of the manufacturing method.

First, by well-known metal organic chemical vapor deposition, the high-mesa etch stop layer 303, the n-type InP clad layer 305, the semiconductor Mach-Zehnder modulator core layer 306, and the p-type InP clad layer 304 are formed on the n-type InP substrate 302 in this order (S101). The thickness of the high-mesa etch stop layer 303 is set to about 5 nm, for example. The semiconductor Mach-Zehnder modulator core layer 306 has, for example, an undoped strained multi-quantum well structure (not shown) which is sandwiched by a pair of InGaAsP light confinement layers (not shown) from above and below.

The n-type InP clad layer 305 needs to be thick enough that the etch stop layer 303 is not etched in view of the distribution in the wafer plane when the high mesa is formed by dry etching. Specifically, in this embodiment, the thickness of the n-type InP clad layer 305 is set to, for example, 0.8 μm to 1.0 μm.

In this embodiment, as described above, the formation of the high-mesa etch stop layer 303 is performed as a part of the first step of crystal growth on the substrate 302. Thus, the increase in manufacturing cost caused by forming the high-mesa etch stop layer 303 can be effectively suppressed.

Next, a region to be left as the semiconductor Mach-Zehnder modulator 201 is covered by, for example, an insulating film mask 601 made of $SiO_2$, and then dry etching and wet etching are performed to remove a semiconductor multilayer structure (the n-type InP clad layer 305, the semiconductor Mach-Zehnder modulator core layer 306, and the p-type InP clad layer 304) positioned in a region in which the semiconductor optical modulator 202 is to be formed (S102).

At this time, the n-type InP clad layer 305 and the etch stop layer 303 under the core layer 306 remain unetched. The reason is as follows. If the n-type InP clad layer 305 and the etch stop layer 303 are etched, a step of 0.8 μm is formed on the semiconductor Mach-Zehnder modulator core layer 306 because the n-type InP clad layer 305 has a thickness of 0.8 μm. Thus, an InP buffer layer having a thickness of about 0.8 μm needs to be provided under the semiconductor optical modulator core layer 307 in the next crystal growth for butt joint connection in order to adjust the height. Therefore, the crystal quality of the semiconductor optical modulator core layer 307 subjected to successive growth may be degraded. The presence of the InP buffer layer makes it difficult to adjust the optical axis, thus causing another problem in that sufficient optical connection between the semiconductor Mach-Zehnder modulator core layer 306 and the semiconductor optical modulator core layer 307 may not be obtained.

Next, crystals of the semiconductor optical modulator core layer 307 and the p-type InP clad layer 304 are grown by, for example, metal organic chemical vapor deposition in the region in which the semiconductor optical modulator 202 is to be formed (S103). The semiconductor optical modulator core layer 307 has an InGaAsP strained multi-quantum well structure (not shown) which is sandwiched by a pair of InGaAsP light confinement layers (not shown) from above and below. Thus, the semiconductor Mach-Zehnder modulator core layer 306 and the semiconductor optical modulator core layer 307 are connected to each other by butt joint.

Next, the insulating film mask 601 is removed by using, for example, buffered hydrofluoric acid. Then, for example, metal organic chemical vapor deposition is used to grow crystals of the p-type InP clad layer 304 on the entire top surface of the substrate in which the semiconductor Mach-Zehnder modulator core layer 306 and the semiconductor optical modulator core layer 307 are connected to each other by butt joint so that the p-type InP clad layer 304 may be increased in thickness. After that, crystals of a p-type InGaAs contact layer 602 are further grown (S104).

Next, a mesa stripe mask 603 made of, for example, a SiO$_2$ film is formed. Then, with the mesa stripe mask 603 used as an etching mask, dry etching is performed to etch a semiconductor multilayer structure halfway through the p-type InP clad layer 304 (S105).

At this time, the semiconductor Mach-Zehnder modulator core layer 306, which is to have a high-mesa structure, is not etched yet, but, in dry etching to be described later, the core layer 306 is completely etched to form the high-mesa structure.

In the formation of the mesa stripe mask 603, for example, a commonly-used technology (such as the steps of forming a SiO$_2$ film by thermal chemical vapor deposition, forming a resist pattern by photolithography, transferring the pattern onto the SiO$_2$ film by dry etching, and removing the resist pattern) is used. In the dry etching, for example, inductively coupled plasma (ICP) dry etching with the use of a commonly-used chlorine-based gas is used.

Next, a region of the semiconductor optical modulator 202, which is to have a low-mesa structure, is covered by a resist mask pattern 604. After that, dry etching is performed to further etch the high mesa in the region of the semiconductor Mach-Zehnder modulator 201, which is to have the high-mesa structure. Specifically, the dry etching is performed to etch the p-type InP clad layer 304, the semiconductor Mach-Zehnder modulator core layer 306, and a part of the n-type InP clad layer 305. In the dry etching, for example, the above-mentioned ICP dry etching is used (S106).

In the etching, the n-type InP clad layer 305 has a thickness of about 1 μm and hence the etch stop layer 303 formed under the n-type InP clad layer 305 is not etched in the entire plane by dry etching.

Next, the resist mask pattern 604 is removed, and then wet etching is performed to remove the remaining part of the n-type InP clad layer 305 in the region, in which the semiconductor Mach-Zehnder modulator 201 is to be formed, and, the remaining part of the p-type InP clad layer 304 in the region, in which the semiconductor optical modulator 202 is to be formed. The removal of the resist mask pattern 604 is performed by, for example, oxygen plasma treatment. In the wet etching, for example, a hydrochloric acid-based wet etchant is used (S107).

In this case, the wet etching is stopped at the high-mesa etch stop layer 303 in the region of the semiconductor Mach-Zehnder modulator 201. In the region of the semiconductor optical modulator 202, the wet etching is stopped at the InGaAsP light confinement layer (not shown) formed at the uppermost part of the semiconductor optical modulator core layer 307, which functions as a low-mesa etch stop layer. Thus, the height of the high mesa becomes uniform. As a result, defects of broken mesa of the high mesa are effectively suppressed.

In other words, in this embodiment, the high-mesa etching step is roughly divided into two steps, that is, an etching step having no material selectivity and an etching step having material selectivity. Thus, the height of the high mesa becomes uniform. As a result, defects of broken mesa of the high mesa is effectively suppressed.

Particularly in the structure in which a waveguide of the semiconductor Mach-Zehnder modulator 201 having a high-mesa structure and a waveguide of the semiconductor optical modulator 202 having a low-mesa structure are formed in a single device, the structure of one or more embodiments of the present invention lead the height of the high mesa and the height of the low mesa to become uniform.

Next, for example, plasma CVD is performed to form the passivation film 309 made of SiO$_2$ on the side wall of the mesa, the top surface of the high-mesa etch stop layer 303, and the top surface of the semiconductor optical modulator core layer 307. After that, for example, a well-known application, baking, or etch back step is performed to form the resin 308, to thereby flatten the overall device (S108).

Next, the mesa stripe mask 603 is removed, and then the semiconductor Mach-Zehnder modulator p-electrode 207 and the semiconductor optical modulator p-electrode 210 are formed. After that, the rear surface is polished to reduce the thickness of the n-type InP substrate 302 to, for example, about 150 μm, to thereby form the n-electrode 301 to complete the wafer step. Finally, the portion in which the optical device 110 is to be formed is cut out of the wafer by cleavage, and the reflection-free coating films 211 and 212 are formed on both end surfaces of the portion 110, respectively (S109). In this way, the optical device 110 is obtained.

According to this embodiment, the high-mesa etch stop layer 303 is provided, and hence the mesa height of the high mesa of the optical waveguide portion 203 in the semiconductor Mach-Zehnder modulator 201 becomes uniform. Thus, the height of the high mesa is prevented from being unnecessarily increased, and hence defects of broken mesa in the manufacturing process are remarkably reduced as compared to the conventional technology. As a result, the optical device 110 in which the semiconductor optical modulator 201 and the semiconductor Mach-Zehnder modulator 202 are integrated, and the optical module 100 including the optical device 110 is produced stably at high yields. Further, according to this embodiment, the optical device 110, in which defects of broken mesa are less liable to occur and which has high device manufacturing yields, is realized. In addition, the optical device 110 is mounted, and hence the optical module 100 is manufactured at low cost.

According to this embodiment, as described above, in the structure in which a waveguide of the semiconductor Mach-Zehnder modulator 201 having a high-mesa structure and a waveguide of the semiconductor optical modulator 202 having a low-mesa structure are formed in a single device, the mesas are formed simultaneously by wet etching, and both the high mesa and the low mesa are formed to have the heights as designed because the high mesa and the low mesa each have an etch stop layer. In addition, the optical device 110 is manufactured while controlling the heights of the mesas stably and accurately.

The present invention is not limited to the above-mentioned embodiment, and may be replaced by substantially the same configuration as described in the embodiment, a configuration having the same functions and effects, or a configuration which can achieve the same object. For example, the case of a so-called ridge waveguide structure in which the periphery of a mesa is not buried with a semiconductor has been described above, but a so-called buried heterostructure (BH) in which the periphery of a mesa is buried with a semiconductor is also applicable.

In this embodiment, the case of integrating the semiconductor Mach-Zehnder modulator 201 and the semiconductor optical modulator 202 has been described above, but the present invention is also applicable to other various integrated optical devices 110, including a combination of the semiconductor Mach-Zehnder modulator 201 and a tunable semiconductor laser and a combination of an electro-absorption optical modulator and a DFB semiconductor laser.

Further, the material of each layer described above is merely an example, and the present invention is not limited thereto. For example, for the substrate 302, another material than InP exemplified in this embodiment, such as GaAs, GaN, or ZnSe, may be used. As the material of the high-mesa etch stop layer 303, another material than InGaAsP, such as InGaAlAs, InGaAs, or InAlAs, may be used as long as the material has etching rate selectivity with respect to the material for forming the clad layers 304 and 305. In addition, in this embodiment, the semiconductor Mach-Zehnder modulator core layer 306 and the semiconductor optical modulator core layer 307 each have a multi-quantum well structure, but those core layers may each be a bulk semiconductor layer.

[Second Embodiment]

Next, a second embodiment of the present invention is described. An optical device 810 in this embodiment is different from the optical device in the first embodiment mainly in that a laser 811, the semiconductor optical modulator 202, and the semiconductor Mach-Zehnder modulator 201 are integrated. A method of manufacturing the optical device 810 in this embodiment is different from the method of manufacturing an optical device in the first embodiment mainly in that only dry etching is used for forming the high mesa of the semiconductor Mach-Zehnder modulator 201. In the following, description of the same parts as in the first embodiment is omitted.

Figure 10:
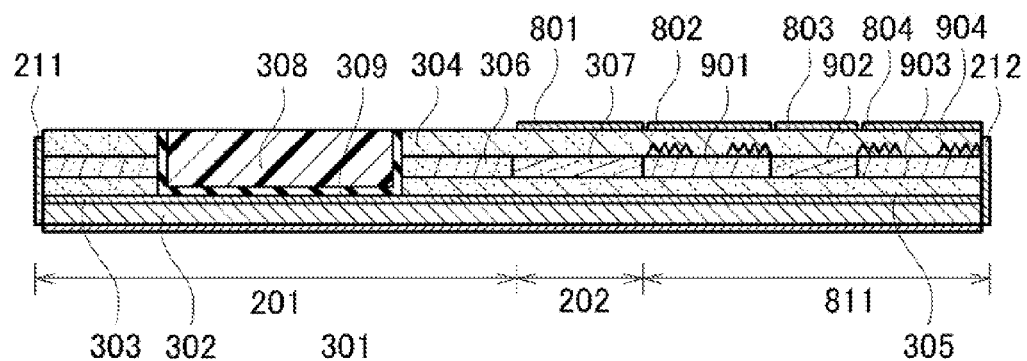
FIG. 10 schematically illustrates a cross-section taken along the line X-X of FIG. 9.
Figure 11:
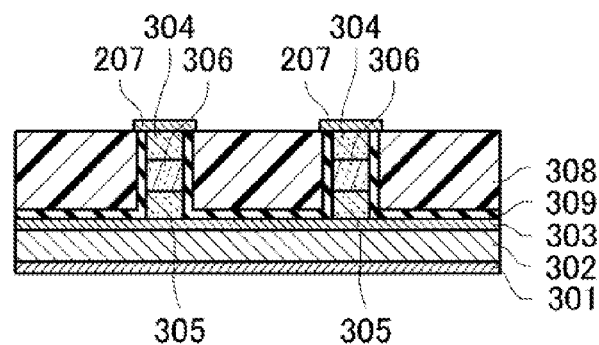
FIG. 11 schematically illustrates a cross-section taken along the line XI-XI of FIG. 9.
Figure 12:
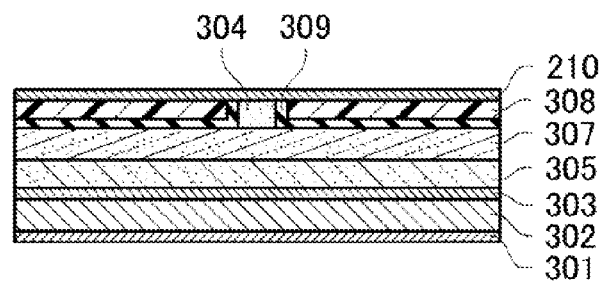
FIG. 12 schematically illustrates a cross-section taken along the line XII-XII of FIG. 9.

FIG. 9 schematically illustrates a top surface of the optical device according to this embodiment. FIG. 10 schematically illustrates a cross-section taken along the line X-X of FIG. 9. FIG. 11 schematically illustrates a cross-section taken along the line XI-XI of FIG. 9. FIG. 12 schematically illustrates a cross-section taken along the line XII-XII of FIG. 9.

As illustrated in FIGS. 9 to 12, similarly to the first embodiment, the optical device 810 includes the n-electrode layer 301, the n-type InP substrate 302 (substrate), and the high-mesa etch stop layer 303 in this order from the bottom of FIG. 10. The high-mesa etch stop layer 303 is disposed on the entire surface of the n-type InP substrate 302.

In this embodiment, the laser 811, the semiconductor optical modulator 202, and the semiconductor Mach-Zehnder modulator 201 are integrated by butt joint on the top of the high-mesa etch stop layer 303. As the laser 811, for example, a 1.55 μm semiconductor Mach-Zehnder modulator integrated tunable laser in which a sampled grating distributed Bragg reflector (SG-DBR) tunable laser is integrated is used.

Specifically, the laser 811 has a structure in which, for example, a 5-period InGaAlAs compressively-strained multi-quantum well gain region is sandwiched by two SG-DBR regions having different longitudinal mode spacings from the front and back. Specifically, as illustrated in FIG. 10, a gain region core layer 902 is formed between an SG-DBR region core layer 901 and an SG-DBR region core layer 903. The gain region core layer 902 and the SG-DBR region core layers 901 and 903 are formed between the p-type InP clad layer 304 and the n-type InP clad layer 305. On the p-type InP clad layer 304, diffraction gratings 904 are formed above the SG-DBR region core layers 901 and 903.

Here, SG-DBR refers to a structure in which a period formed of a region having the diffraction gratings 904 and a region having no diffraction gratings 904 are repeated a plurality of times. The diffraction gratings 904 have a period structure of InGaAsP formed in the p-type InP clad layer 304.

The material compositions of the layers formed at the uppermost parts of the SG-DBR region core layer 901, the gain region core layer 902, the SG-DBR region core layer 903, and the semiconductor optical modulator core layer 307 are all InGaAlAs (not shown), for example. The InGaAlAs layers function as low-mesa etch stop layers. The semiconductor Mach-Zehnder modulator core layer 306 is, for example, a 30-period InGaAlAs unstrained multi-quantum well which is sandwiched by InGaAlAs light confinement layers from above and below. For example, the thickness of a quantum well layer is about 5 nm and the thickness of a barrier layer is about 10 nm. Above the SG-DBR region core layer 901, the gain region core layer 902, and the SG-DBR region core layer 903, a laser gain region p-electrode 802, a front sampled grating DBR p-electrode 803, and a rear sampled grating DBR p-electrode 804, are formed respectively, which are connected to corresponding electrode pads 804 to 806.

As illustrated in FIGS. 11 and 12, the laser 811 and the semiconductor optical modulator 202 each have a low-mesa optical waveguide structure, and the semiconductor Mach-Zehnder modulator 201 has a high-mesa optical waveguide structure. In this embodiment, the low mesa of the semiconductor optical modulator 202 and the high mesa of the semiconductor Mach-Zehnder modulator 201 are each formed into a mesa shape having high perpendicular anisotropy. In other words, no tapered portion having a skirt shape is formed in the low mesa and the high mesa. Thus, the mesa width is formed with high dimension accuracy. Similarly, the low mesa of the laser 811 is formed.

Next, a method of manufacturing the optical device 810 according to this embodiment is described. The manufacturing method in this embodiment is different from the manufacturing method in the first embodiment mainly in that only dry etching is used for forming the high mesa and the low mesa. In the following, description of the same parts as in the first embodiment is omitted.

As described above, in the first embodiment, in the mesa etching step, the mesa is first etched halfway by dry etching with the use of a chlorine-based gas having no material selectivity, and after that, InP is additionally etched by hydrochloric acid-based wet etching having material selectivity, to thereby form the mesa. As the etch stop layer, for example, InGaAsP is used.

In this embodiment, on the other hand, an etching technology having material selectivity, for example, dry etching with a mixed gas of ethane, oxygen, and hydrogen is used, and InGaAlAs is used as the etch stop layer. For example, dry etching with the use of a gas obtained by adding oxygen to a hydrocarbon-based gas such as ethane exhibits such selectivity that an etching rate of InGaAlAs is remarkably slower than an etching rate of InP and InGaAsP. Thus, in this embodiment, selective etching is performed with the use of this dry etching.

The high mesa of the semiconductor Mach-Zehnder modulator 201 is formed by stopping etching at, for example, the high-mesa etch stop layer 303 made of InGaAlAs. The low mesa is formed by stopping etching at, for example, the top of each of the InGaAlAs layer provided as the uppermost layer of the semiconductor optical modulator core layer 307, the InGaAlAs layer provided as the uppermost layer of the SG-DBR region core layer 901, the InGaAlAs layer provided at the uppermost part of the gain region core layer 902 made of an InGaAlAs compressively-strained multi-quantum well, and the InGaAlAs layer provided at the uppermost part of the SG-DBR region core layer 903.

According to this embodiment, the low mesas of the semiconductor optical modulator 202 and the laser 811 and the high mesa of the semiconductor Mach-Zehnder modulator 201 are each formed into a mesa shape having high perpendicular anisotropy, and hence a tapered portion having a skirt shape is not formed unlike the first embodiment. Thus, the mesa width is formed with high dimension accuracy. The height of the high mesa is defined by the position of the high-mesa etch stop layer 303, and hence the high mesa is formed to have a uniform height of, for example, about 4.5 μm. Thus, defects of broken mesa of the high mesa are effectively prevented. As a result, the optical device 810 and the like is formed at high yields.

The present invention is not limited to the above-mentioned embodiments, and may be replaced by substantially the same configuration as described in the embodiments, a configuration having the same functions and effects, and a configuration that can achieve the same object.

For example, the above description is mainly an example of using the optical device 810 having an oscillation wavelength of 1.55 μm band, but the present invention is not limited thereto, and also applicable to other devices, such as a device having an oscillation wavelength of 1.3 μm band. In this embodiment, the optical device 811 in which a semiconductor Mach-Zehnder modulator and a tunable laser are integrated has been described, but the present invention is also applicable to other integrated optical devices, such as an optical device in which a beam expander and a semiconductor laser are integrated. Further, in this embodiment, the optical device 810 in which the main direction of the mesa stripe is the forward mesa direction has been described above, but the present invention is similarly applicable to an integrated optical device in which the main direction of the mesa stripe is the reverse mesa direction.

Further, in this embodiment, description has been given of the use of only dry etching for forming the high mesa of the semiconductor Mach-Zehnder modulator 201 in the optical device 810 in which the laser 811, the semiconductor optical modulator 202, and the semiconductor Mach-Zehnder modulator 201 are integrated, but, similarly to the first embodiment, dry etching and wet etching may be used in the optical device 810 in which the laser 811, the semiconductor optical modulator 202, and the semiconductor Mach-Zehnder modulator 201 are integrated. Further, in the optical device 810 in the first embodiment, only dry etching may be used as in this embodiment.

[Third Embodiment]

Next, a third embodiment of the present invention is described. An optical device 120 in this embodiment is different from the optical device in the first embodiment mainly in that a semiconductor Mach-Zehnder modulator 201 having a high-mesa optical waveguide structure and a semiconductor laser 122 having a low-mesa optical waveguide structure are monolithically-integrated and that a low-mesa etch stop layer 132 is independently formed. In the following, description of the same parts as in the first embodiment is omitted.

Figure 13:
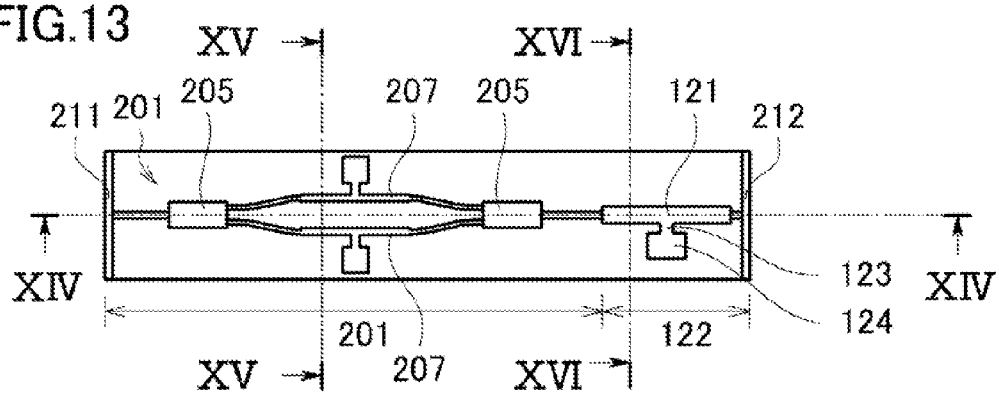
FIG. 13 schematically illustrates a top surface of an optical device according to a third embodiment of the present invention.
Figure 14:
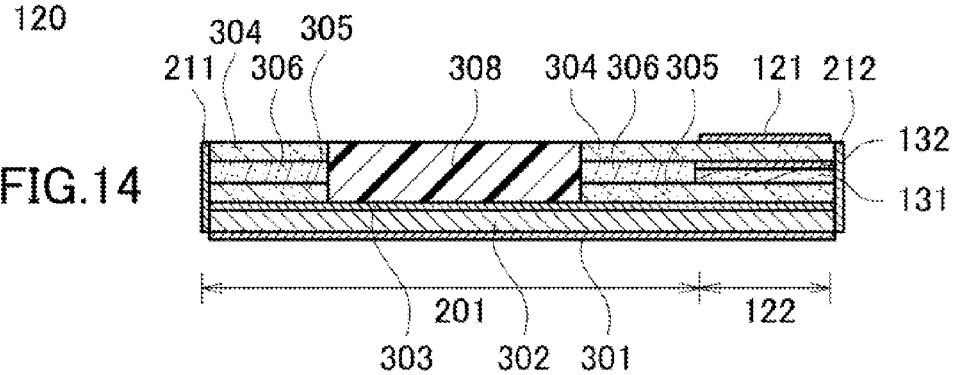
FIG. 14 schematically illustrates a cross-section taken along the line XIV-XIV of the optical device illustrated in FIG. 13.
Figure 15:
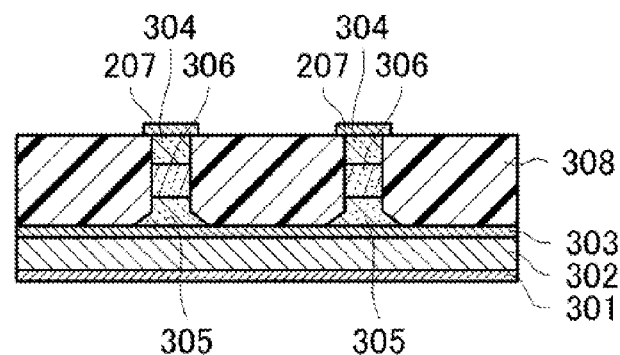
FIG. 15 schematically illustrates a cross-section taken along the line XV-XV of the optical device illustrated in FIG. 13.
Figure 16:
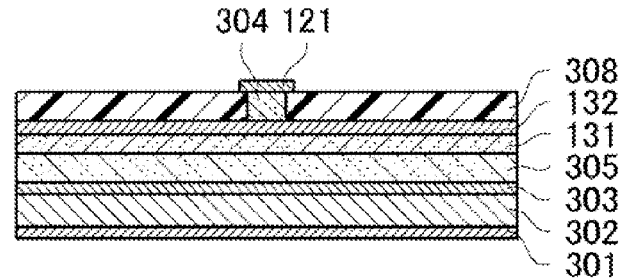
FIG. 16 schematically illustrates a cross-section taken along the line XVI-XVI of the optical device illustrated in FIG. 13.

FIG. 13 schematically illustrates a top surface of the optical device according to this embodiment. FIG. 14 schematically illustrates a cross-section taken along the line XIV-XIV of the optical device illustrated in FIG. 13. FIG. 15 schematically illustrates a cross-section taken along the line XV-XV of the optical device illustrated in FIG. 13. FIG. 16 schematically illustrates a cross-section taken along the line XVI-XVI of the optical device illustrated in FIG. 13.

As illustrated in FIG. 13, the optical device 120 according to this embodiment includes the semiconductor Mach-Zehnder modulator 201 and the semiconductor laser 122. The semiconductor Mach-Zehnder modulator 201 and the semiconductor laser 122 are connected to each other by butt joint. A laser electrode 121 is disposed in a region in which the semiconductor laser 122 is formed. The laser electrode 121 is connected to an electrode pad 124 via a lead wire 123.

As illustrated in FIG. 14, the high-mesa etch stop layer 303 is formed on the entire surface of the n-type InP substrate 302, and the semiconductor Mach-Zehnder modulator 201 and the semiconductor laser 122 are formed at the top of the high-mesa etch stop layer 303.

As illustrated in FIG. 15, similarly to the first embodiment, the optical waveguide portion 203 (corresponding to the high mesa) of the semiconductor Mach-Zehnder modulator 201 in the optical device 120 includes the n-type InP clad layer 305, the semiconductor Mach-Zehnder modulator core layer 306, and the p-type InP clad layer 304 in this order from the substrate 302 side. For example, the high mesa has a width of about 1.5 μm and a height of about 4.5 μm.

As illustrated in FIG. 16, the semiconductor laser 122 has a low-mesa optical waveguide structure, in which the n-type InP clad layer 305, a semiconductor laser quantum well layer 131, and the low-mesa etch stop layer 132 are laminated on the high-mesa etch stop layer 303 in this order from the substrate 302 side. The p-type InP clad layer 304 is further laminated in a region in which the low mesa is formed, and the resin 308 is further laminated in a region in which the low mesa is not formed. The laser electrode 121 is laminated so as to cover the top of the low mesa.

In the first embodiment, the InGaAsP light confinement layer (not shown) formed at the uppermost part of the semiconductor optical modulator core layer 307 functions as the low-mesa etch stop layer. This embodiment is different from the first embodiment in that the low-mesa etch stop layer 132 is provided at the top of the semiconductor laser quantum well layer 131. As the low-mesa etch stop layer 132, for example, InGaAsP or InGaAlAs is used.

According to a method of manufacturing the optical device 120 in this embodiment, similarly to the first embodiment, selective etching with the use of dry etching and wet etching is performed in the high-mesa etching step. Thus, similarly to the first embodiment, the mesa height of the high mesa can be made uniform, and, in the case where the mesa stripe is in the forward mesa direction, a tapered portion having a skirt shape, whose principal surface is a (211) crystal surface, can be formed at the root of the high mesa.

According to this embodiment, the high-mesa etch stop layer 303 is provided, and hence the mesa height of the high mesa optical waveguide 204 becomes uniform. Thus, the height of the high mesa is prevented from being unnecessarily increased, and hence defects of broken mesa in the manufacturing process are remarkably reduced as compared to the conventional technology. Further, the tapered portion having a skirt shape is provided at the bottom of the high mesa as described above, and hence the mechanical strength of the high mesa is further enhanced.

The present invention is not limited to the above-mentioned first to third embodiments, and may be replaced by substantially the same configuration as described in the embodiments, a configuration having the same functions and effects, or a configuration which can achieve the same object. For example, the case of using a semiconductor Mach-Zehnder modulator, a sampled grating distributed Bragg reflector tunable laser, a semiconductor optical modulator, and the like has been described above as an example, but different types of modulators, lasers, and amplifiers may be used alone or in combination as long as substantially the same configuration as described in the embodiments, a configuration having the same functions and effects, or the same object is achieved. Further, the material of each layer described above is merely an example, and the present invention is not limited thereto. In addition, the case of two modulated waveguides 206 has been described above, but a different number of modulated waveguides 206 may be included. Note that, a first optical waveguide described in the scope of claims corresponds to, for example, the high mesa in the first to third embodiments and a second optical waveguide corresponds to, for example, the low mesa in the first to third embodiments.

What is claimed is:

1. An optical device comprising:
    a substrate;
    a first optical waveguide including a mesa, where the mesa includes:
        a first lower clad layer portion,
        a first core layer portion, and
        a first upper clad layer portion,
        where the first lower clad layer portion, the first core layer portion, and the first upper clad layer portion are disposed in this order from the substrate side;
    a first etch stop layer configured to stop etching when the first optical waveguide is formed, the first etch stop layer being laminated over the substrate, and the first optical waveguide being laminated on the first etch stop layer;
    a second optical waveguide which includes a second lower clad layer portion, a second core layer portion, and a mesa-shaped second upper clad layer portion in this order from the substrate side, the second optical waveguide being laminated on the first etch stop layer,
    wherein the first core layer portion and the second core layer portion are optically connected to each other, and
    wherein the second core layer portion includes a second core layer configured to stop etching when the second optical waveguide is formed.

2. The optical device according to claim 1,
    wherein the first optical waveguide includes a tapered portion in a region that is brought into contact with the first etch stop layer, and
    wherein the tapered portion has a width increasing toward the substrate side.

3. The optical device according to claim 1, wherein:
    the first optical waveguide has a high-mesa structure in which the first lower clad layer portion, the first core layer portion, and the first upper clad layer portion are processed by etching; and
    the second optical waveguide has a mesa structure in which the mesa-shaped second upper clad layer portion is processed by etching.

4. An optical device comprising:
    a substrate;
    a first optical waveguide including a mesa, where the mesa includes:
        a first lower clad layer portion,
        a first core layer portion,
        a first upper clad layer portion,
        where the first lower clad layer portion, the first core layer portion, and the first upper clad layer portion are disposed in this order from the substrate side;
    a first etch stop layer configured to stop etching when the first optical waveguide is formed, the first etch stop layer being laminated over the substrate, and the first optical wavequide being laminated on the first etch stop layer;
    a second optical wavequide which includes a second lower clad layer portion, a second core layer portion, and a mesa-shaped second upper clad layer portion in this order from the substrate side, the second optical wavequide being laminated on the first etch stop layer,
    wherein the first core layer portion and the second core layer portion are optically connected to each other, and
    wherein the second optical waveguide further includes a second etch stop layer configured to stop etching when the second optical waveguide is formed into a mesa structure, the second etch stop layer being disposed between the second core layer portion and the mesa-shaped second upper clad layer portion.

5. The optical device according to claim 1, wherein the first etch stop layer is formed of one of InGaAsP and InGaAlAs, and the substrate is InP.

6. The optical device according to claim 5, wherein the one of InGaAsP and InGaAlAs, which forms the first etch stop layer, is lattice-matched with InP, which forms the substrate.

7. The optical device according to claim 1, wherein the first etch stop layer covers an entire surface of the substrate.

8. The optical device according to claim 1, wherein the optical device comprises an integrated optical device in which a semiconductor Mach-Zehnder optical modulator including the first optical waveguide and a semiconductor optical modulator including the second optical waveguide are integrated.

9. The optical device according to claim 1, wherein the first lower clad layer portion and the second lower clad layer portion are formed by the same clad layer.

10. An optical module comprising the optical device according to claim 1.

11. A method for manufacturing an optical device comprising:
    forming a first etch stop layer over a substrate;
    forming a laminate structure on the first etch stop layer, the laminate structure including a first lower clad layer, a first core layer, and a first upper clad layer in this order;
    etching the laminate structure up to the first etch stop layer so as to form a first optical waveguide including a mesa, wherein the mesa includes a first lower clad layer portion, a core layer portion, and a first upper clad layer portion;
    forming a second laminate structure above the first etch stop layer, wherein the second laminate structure includes a second core layer, a second etch stop layer, and a second clad layer; and
    etching the second laminate structure up to the second etch stop layer so as to form a second optical waveguide,
    wherein the first core layer and the second core layer are optically connected.

12. A method for manufacturing an optical device comprising:
    forming a first etch stop layer over a substrate;
    forming a first laminate structure on the first etch stop layer, where the first laminate structure includes a first lower clad layer, a first core layer, and a first upper clad layer in this order;
    forming a second laminate structure above the first etch stop layer, where the second laminate structure includes a second core layer, a second etch stop layer, and a second clad layer configured to form a second optical waveguide;
    a first etching step of etching the first laminate structure and the second laminate structure up to a part of the second clad layer;
    a second etching step of etching the first laminate structure up to a part of the first lower clad layer, while masking the second laminate structure; and
    a third etching step of etching the first laminate structure and the second laminate structure up to the first etch stop layer and the second etch stop layer after a mask is removed,
    wherein a first optical waveguide and a second optical waveguide are formed simultaneously, wherein the first optical waveguide has a mesa-structure, which includes a mesa including the first lower clad layer, the first core layer, and the first upper clad layer, wherein the second optical waveguide has a mesa-structure, which includes a mesa including the second clad layer, and wherein the first core layer portion and the second core layer portion are optically connected to each other.

13. The optical device according to claim 4, wherein the first optical waveguide includes a tapered portion in a region that is brought into contact with the first etch stop layer, and wherein the tapered portion has a width increasing toward the substrate side.

14. The optical device according to claim 4, wherein:

the first optical waveguide has a high-mesa structure in which the first lower clad layer portion, the first core layer portion, and the first upper clad layer portion are processed by etching; and the second optical waveguide has a mesa structure in which the mesa-shaped second upper clad layer portion is processed by etching.

15. The optical device according to claim 4, wherein the first etch stop layer is formed of one of InGaAsP and InGaAlAs, and the substrate is InP, wherein the one of InGaAsP and InGaAlAs, which forms the first etch stop layer, is lattice-matched with InP, which forms the substrate, and wherein the first etch stop layer covers an entire surface of the substrate.

16. The optical device according to claim 4, wherein the optical device comprises an integrated optical device in which a semiconductor Mach-Zehnder optical modulator including the first optical waveguide and a semiconductor optical modulator including the second optical waveguide are integrated.

17. An optical module comprising the optical device according to claim 4.

* * * * *